United States Patent
Tsai et al.

(10) Patent No.: US 8,067,696 B2
(45) Date of Patent: Nov. 29, 2011

(54) PRINTED CIRCUIT BOARD AND METHOD FOR MANUFACTURING SAME

(75) Inventors: Chung-Jen Tsai, Taoyuan (TW); Chia-Cheng Chen, Taoyuan (TW); Hung-Yi Chang, Taoyuan (TW); Tung-Yao Kuo, Taoyuan (TW); Cheng-Hsien Lin, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 391 days.

(21) Appl. No.: 12/389,521

(22) Filed: Feb. 20, 2009

(65) Prior Publication Data
US 2010/0038116 A1  Feb. 18, 2010

(30) Foreign Application Priority Data
Aug. 14, 2008  (CN) .......................... 2008 1 0303765

(51) Int. Cl.
  *H05K 1/00* (2006.01)
(52) U.S. Cl. ........................................................ 174/254
(58) Field of Classification Search ............ 174/254–262
  See application file for complete search history.

(56) References Cited

U.S. PATENT DOCUMENTS 6,252,176 B1 * 6/2001 Kuramochi et al. .......... 174/255
2006/0071345 A1   4/2006 Chiu et al.

* cited by examiner

*Primary Examiner* — Javaid Nasri
(74) *Attorney, Agent, or Firm* — Altis Law Group, Inc.

(57) ABSTRACT

A printed circuit board includes an insulating layer, a copper layer formed on the insulating layer and a reinforcing layer formed on the copper layer at opposite sides of the given portion. The copper layer includes a plurality of electrical traces at a given portion thereof. A thickness of the reinforcing layer increases in a direction away from the given portion. A method for manufacturing the printed circuit board is also provided in this disclosure.

12 Claims, 11 Drawing Sheets

PRINTED CIRCUIT BOARD AND METHOD FOR MANUFACTURING SAME

BACKGROUND

1. Technical Field

The present disclosure generally relates to printed circuit boards (PCBs), particularly relates to a PCB having a reinforcing layer formed on a peripheral portion thereof and a method for manufacturing the same.

2. Discussion of Related Art

PCBs are important components in various electronic devices. To meet miniaturization requirements of electronic devices, PCBs become thinner and thinner. However, warping easily occurs in thin PCBs due to internal stress present therein, particularly in peripheral portions of the PCBs, which finally may cause registration errors during a manufacturing process of the PCBs, or an assembling process of PCB with other electronic elements. Generally, the degree of warping increases with the distance to the center of the PCB.

What is needed, therefore, is a PCB and a method for manufacturing the same to overcome the above-described problems.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of embodiments. Moreover, in the drawings, like reference numerals designate corresponding parts throughout the different views.

DETAILED DESCRIPTION OF EMBODIMENTS

Figure 1:
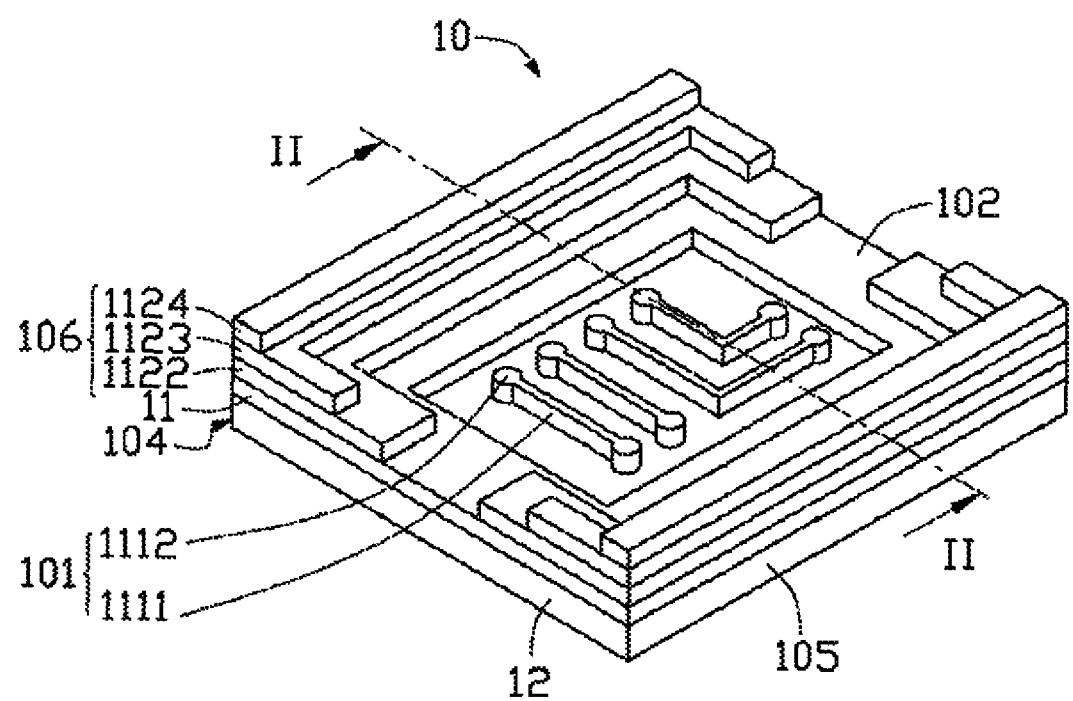
FIG. 1 is an isometric view of a PCB according to a first embodiment.
Figure 2:
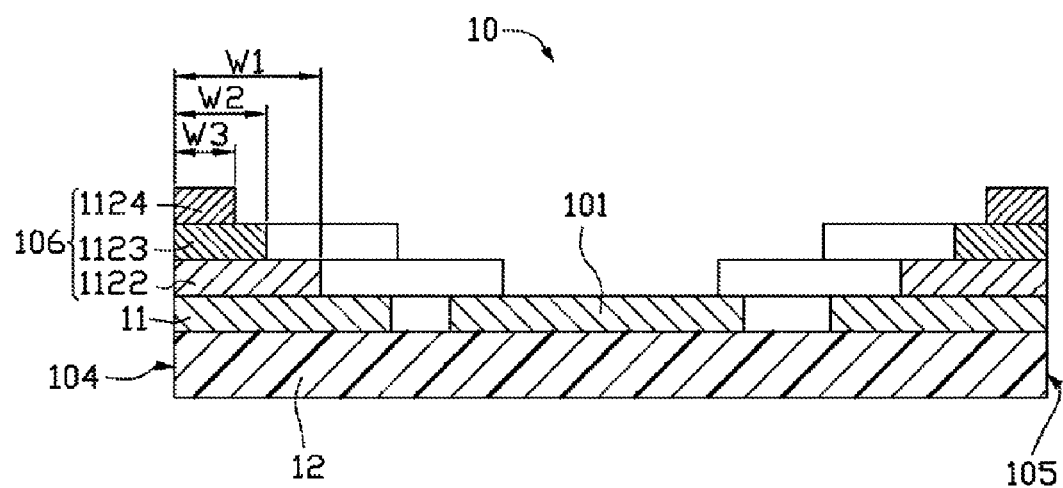
FIG. 2 is a cross-section view of the PCB along line II-II.

Referring to FIGS. 1 and 2, a square shaped PCB 10 provided in a first embodiment includes an insulating layer 12, a copper layer 11, and a reinforcing layer 106 disposed on the copper layer 11. In the illustrated embodiment, the insulating layer 12 and the copper layer 11 cooperate to form a copper clad laminate (CCL). The reinforcing layer 106 is configured for counteracting and compensating internal stress present in the CCL which may otherwise cause warping deformation of the CCL. Due to the reinforcing layer 106, a flatness of the CCL can readily be maintained.

The insulating layer 12 can be comprised of polyimide, polyethylene terephthalate, polytetrafluorethylene, polyamide, polymethylmethacrylate, polycarbonate, polyamide polyethylene-terephthalate copolymer, glass fiber/resin compound, or other suitable material. In the illustrated embodiment, the insulating layer 12 is made of polyimide, and has a first side surface 104 and an opposite second side surface 105. The PCB 10 includes a central portion 101 and a peripheral portion 102 surrounding the central portion 101. The central portion 101 includes a plurality of electrical traces 1111 and connecting pads 1112 electrically connected thereto. The copper layer 11 forms on the insulating layer 12 and surrounds the central portion 101. The reinforcing layer 106 is disposed on the copper layer 11, and includes a first layer 1122, a second layer 1123, and a third layer 1124, which are stacked in the described order with side surfaces thereof aligned with each other. Thicknesses of the three layers 1122, 1123, and 1124 are substantially the same. Widths of the three layers 1122, 1123, 1124 in a direction along a line II-II gradually decrease in the described order. That is, W1>W2>W3, where W1 represents the width of the first layer 1122, W2 represents the width of the second layer 1123 and W3 represents the width of the third layer 1124. In other words, a thickness of the reinforcing layer 106 increases in a direction from the center of the PCB 10 to a periphery thereof. It is understood that the greater the thickness of the reinforcing layer 106, the more difficult it is for the PCB 10 to warp. Thus, a degree of warping of the PCB 10 is decreased. In addition, a thicker reinforcing layer 106 will provide greater weight to act against warping of the PCB 10.

Alternatively, the number of layers of the reinforcing layer can be other than three, but not less than two. The thickness of each of the first, second, third layers 1122, 1123, and 1124 is different from the others.

A method for fabricating the PCB 10 is described in detail as follows.

Figure 3:
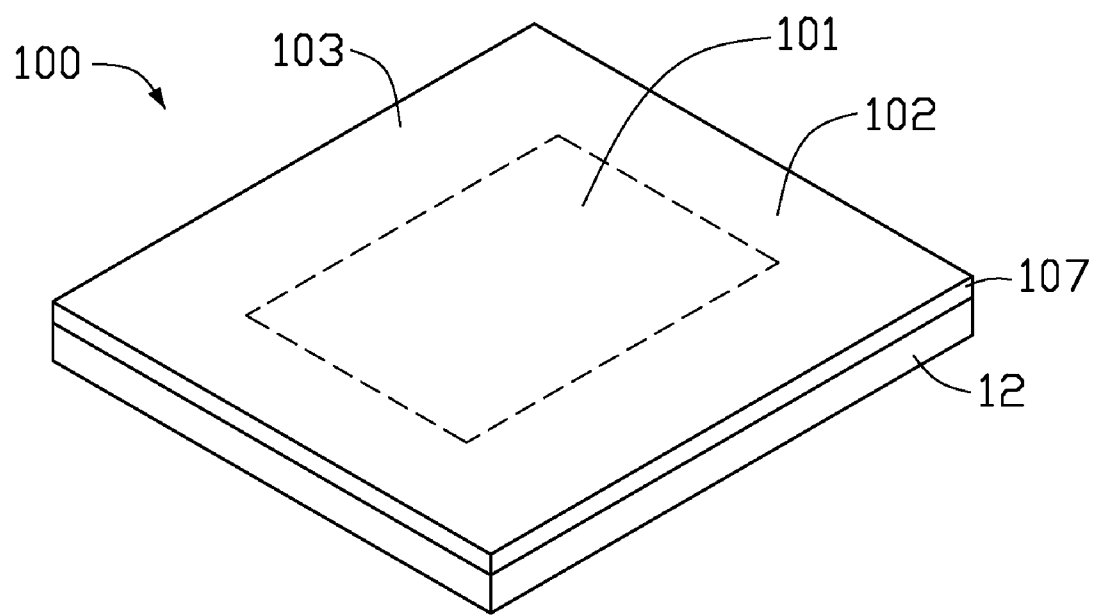
FIG. 3 is an isometric view of a CCL including an insulating layer and a copper layer according to a first embodiment.

Referring to FIG. 3, a copper clad laminate (CCL) 100, including an insulating layer 12 and a copper layer 107 thereon is provided. The copper layer 107 is configured for forming electrical traces and connecting pads. The copper layer 107 has a top surface 103, and includes a central portion 101 and a peripheral portion 102. In addition, the CCL 100 can also include two copper layers 107 respectively disposed on two opposite surfaces of the insulating layer 12.

Figure 4:
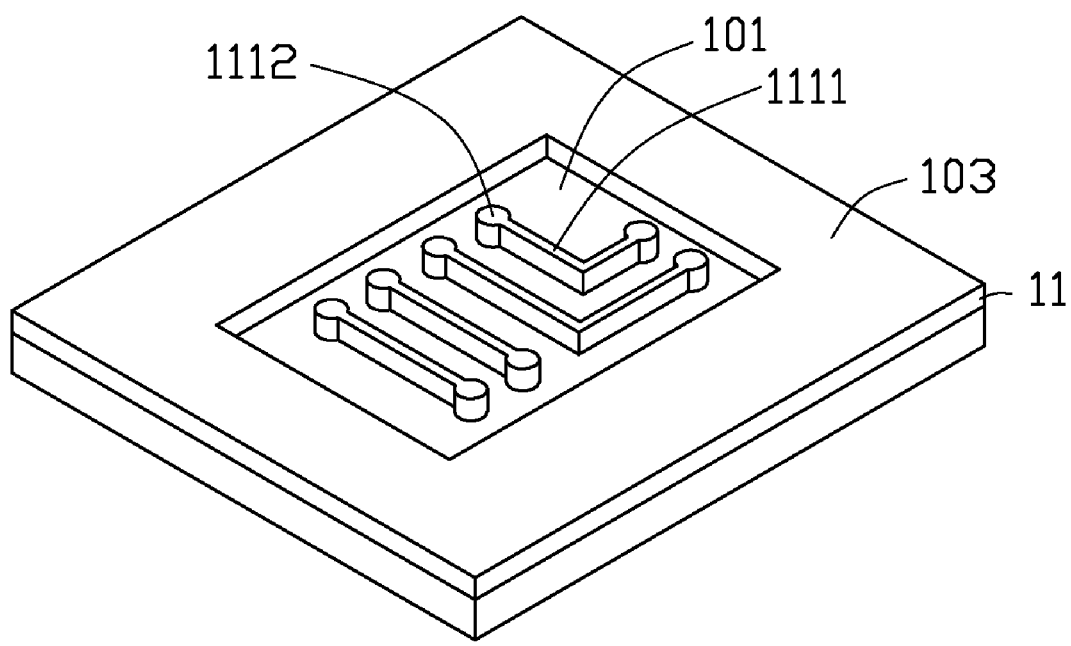
FIG. 4 is similar to FIG. 3, but also including a plurality of electrical traces and connecting pads.

Referring to FIGS. 3 and 4, a plurality of electrical traces 1111 and connecting pads 1112 are formed in the central portion 101 of the copper layer 107 using a typical method including any one or more of exposing, developing and etching processes, while the remaining portion of the copper layer 107 is defined as the copper layer 11 (shown in FIG.1).

Figure 5:
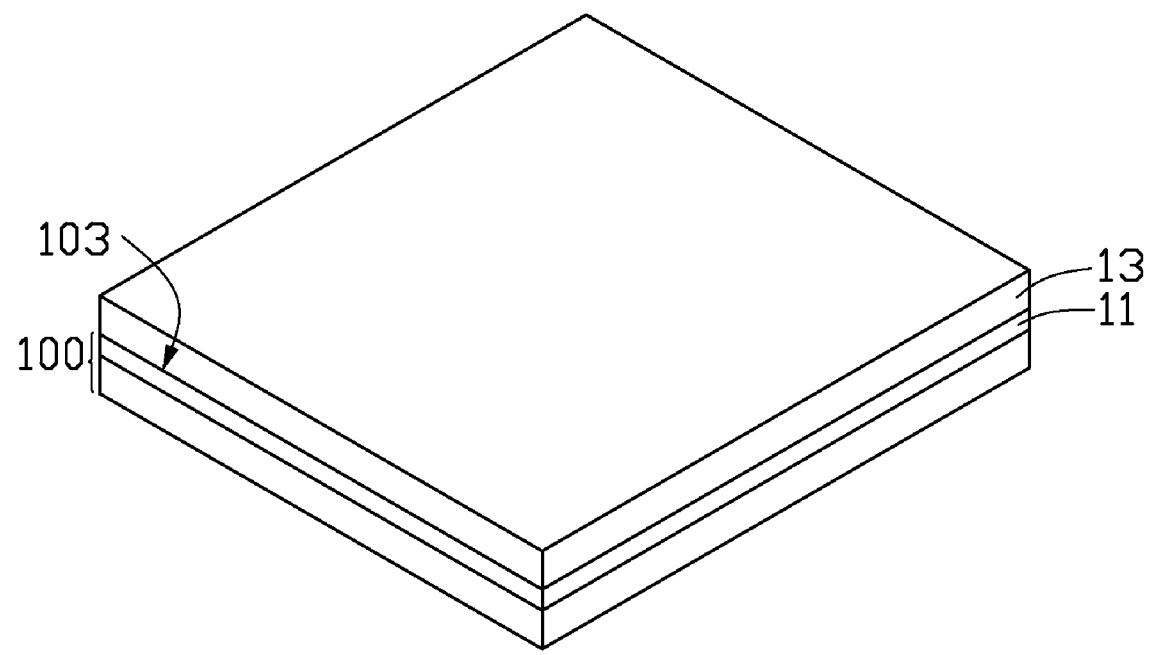
FIG. 5 is similar to FIG. 4, but showing a step of applying a photoresist layer to cover the copper layer.

Referring to FIGS. 4 and 5, a photoresist layer 13 is applied onto the top surface 103 of the CCL 100 to cover the electrical traces 1111, the connecting pads 1112, and the copper layer 11. The photoresist layer 13 is comprised of positive photoresist capable of decomposing under light irradiation. In addition, the photoresist layer 13 can also be negative photoresist, which is capable of being polymerized under light irradiation.

Figure 6:
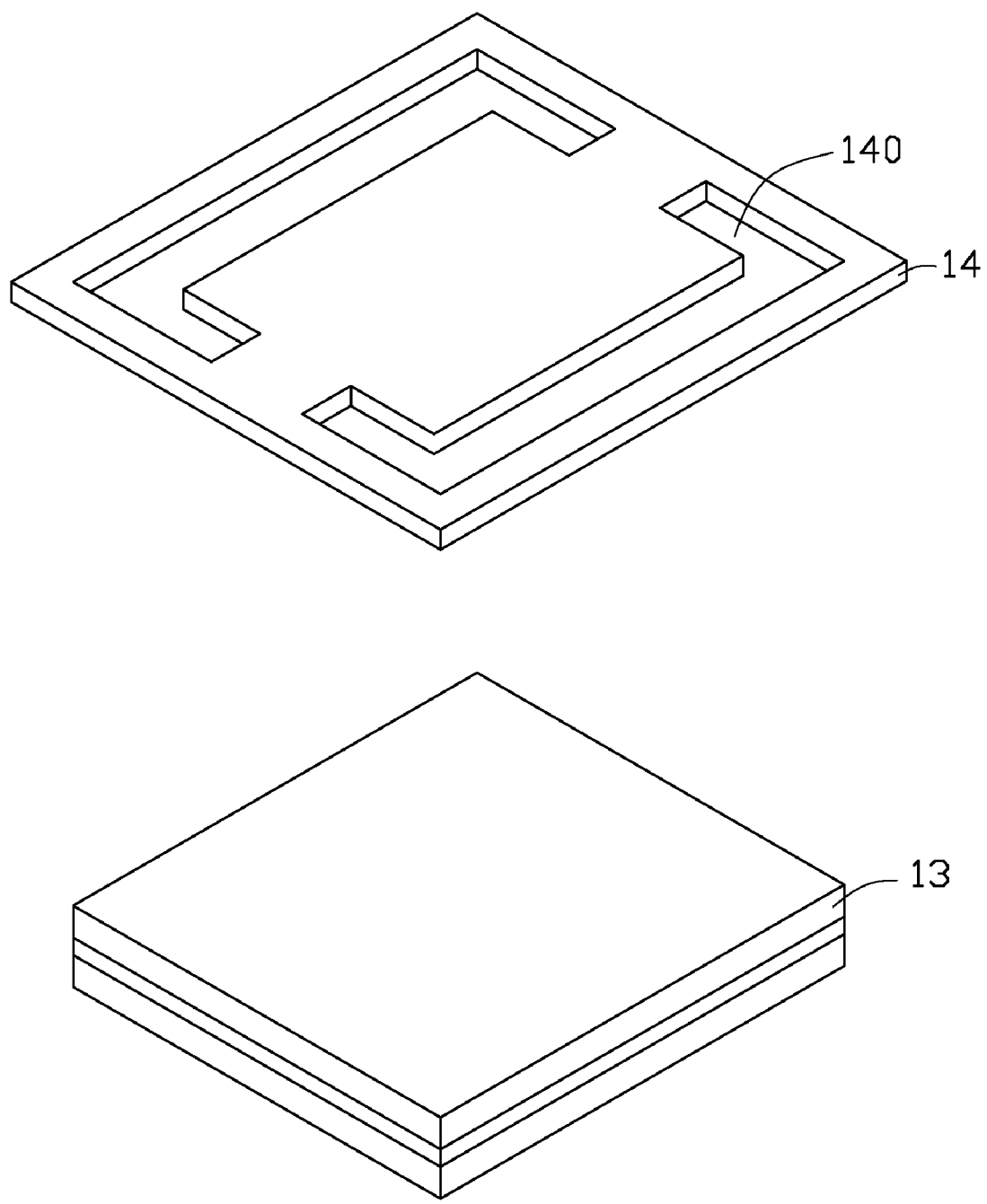
FIG. 6 is similar to FIG. 5, but showing a step of exposing the photoresist layer.

Referring to FIGS. 2 and 6, the photoresist layer 13 is exposed using a photomask 14 defining two through openings 140. Thereafter, referring to FIGS. 6 and 7, a portion (not shown) of the photoresist layer 13 decomposes, thereby exposing a corresponding portion 11a of the copper layer 11, and forming a remaining portion 13a on the copper layer 11.

Figure 7:
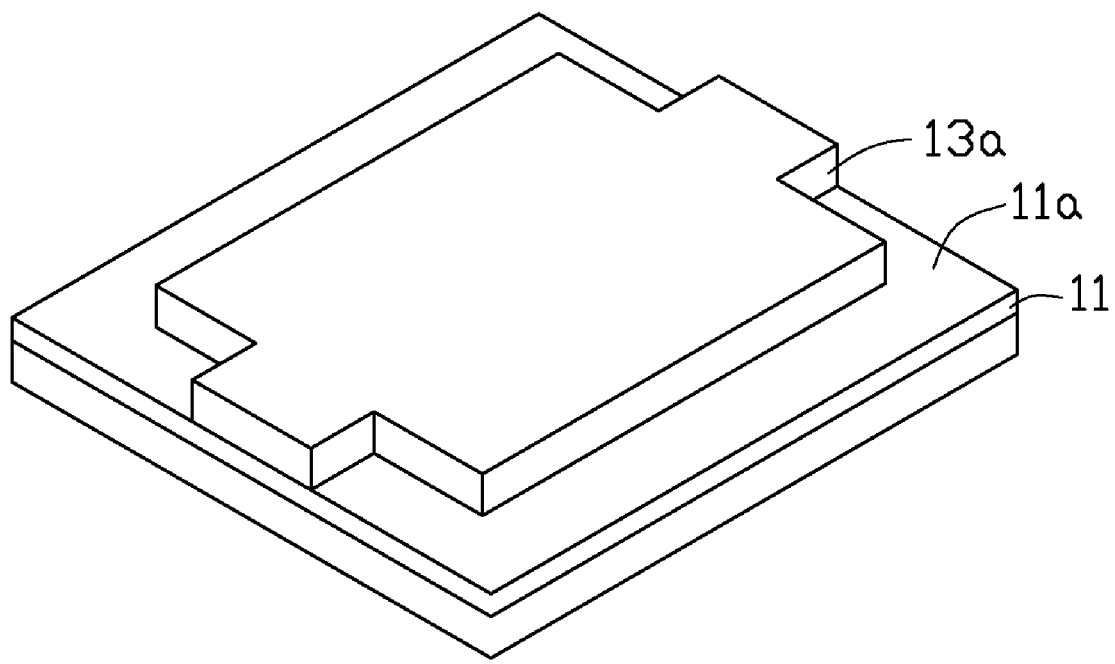
FIG. 7 is similar to FIG. 6, but showing a portion of the copper layer exposed.
Figure 8:
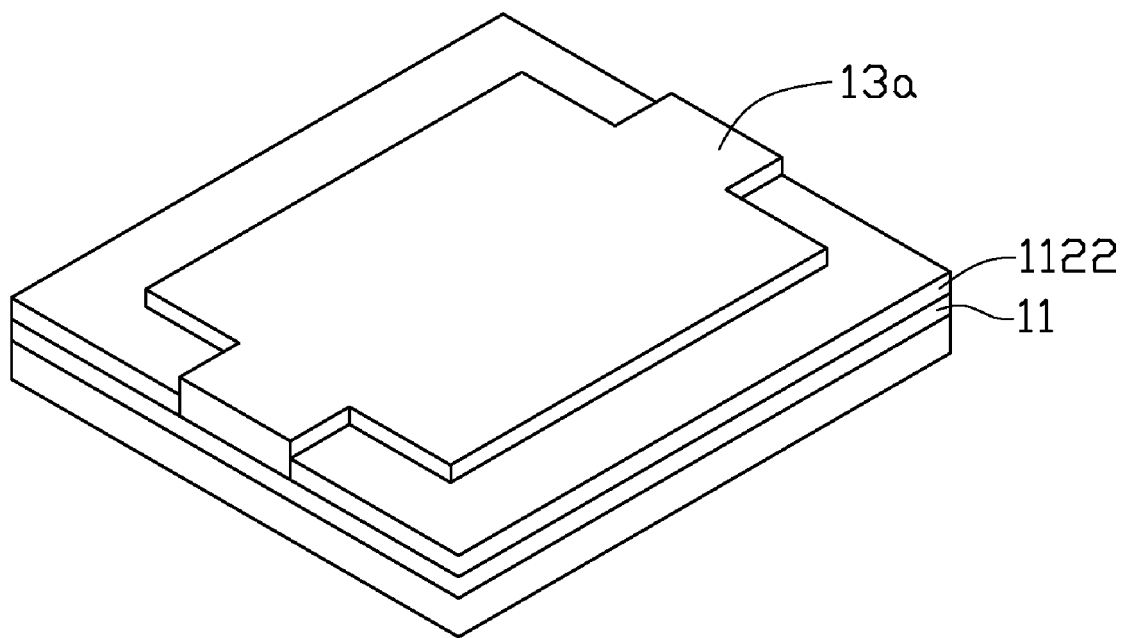
FIG. 8 is similar to FIG. 7, but showing a step of a first layer formed on the copper layer.
Figure 9:
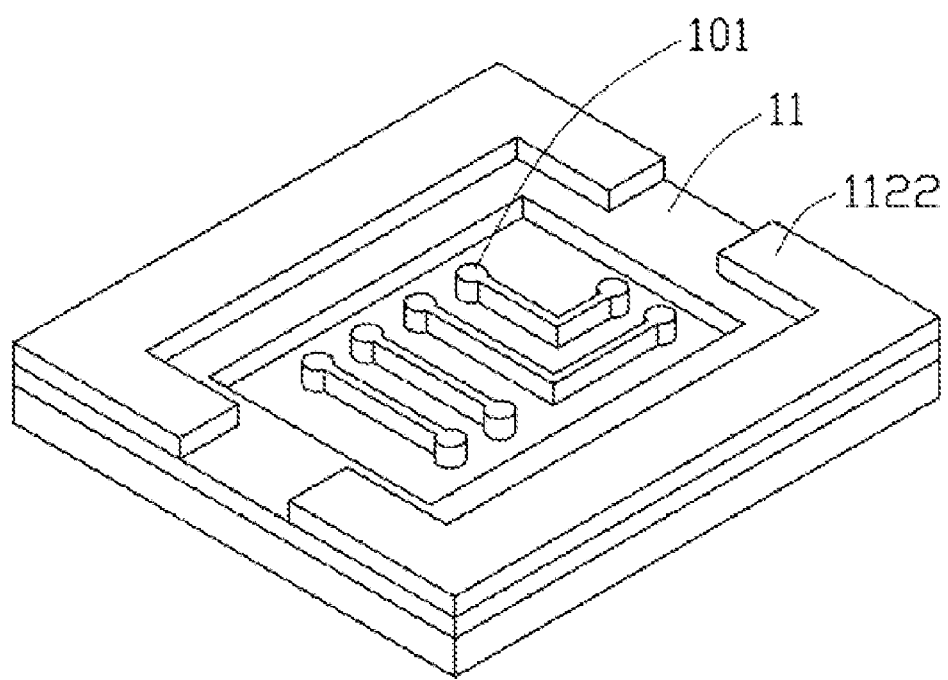
FIG. 9 is similar to FIG. 8, but showing a PCB having the first layer.

Referring to FIGS. 7 and 8, a first layer 1122 is formed on the portion 11a using a typical electro-less plating process or an electro-plating process. Referring to FIGS. 8 and 9, the remaining portion 13a of the photoresist layer 13 is removed thereby exposing the electrical traces 1111. The second and third layers 1123, 1124 can be formed using a method similar to that of the first layer 1122. In addition, the reinforcing layer 106 and the peripheral portion 102 of the CCL 10 can be removed.

Figure 10:
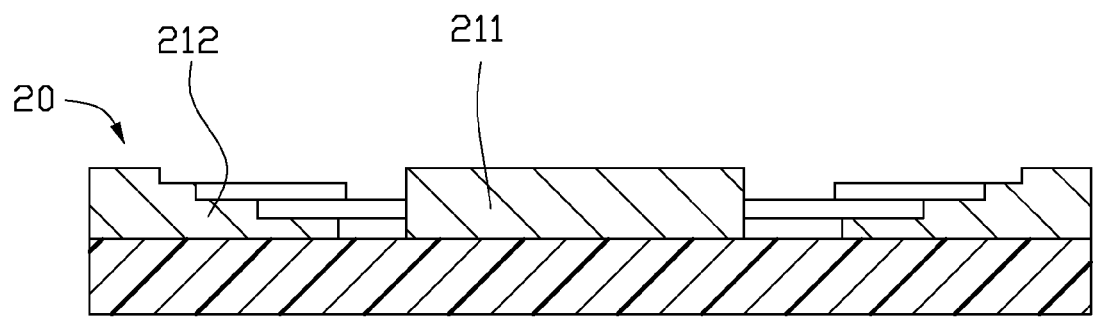
FIG. 10 is an isometric view of a PCB according to a second embodiment.

Referring to FIG. 10, a second PCB 20 is provided in a second embodiment, differing from the PCB 10 in that the reinforcing layer 212 is a single layer structure and the greatest thickness thereof is substantially equal to that of the electrical traces 211. The reinforcing layer 212 is obtained using a method comprising forming a metal layer (not shown) on the peripheral portion using an electro-less plating process or an electro-plating process, and a series of known developing and etching processes after forming the electrical traces 211.

Figure 11:
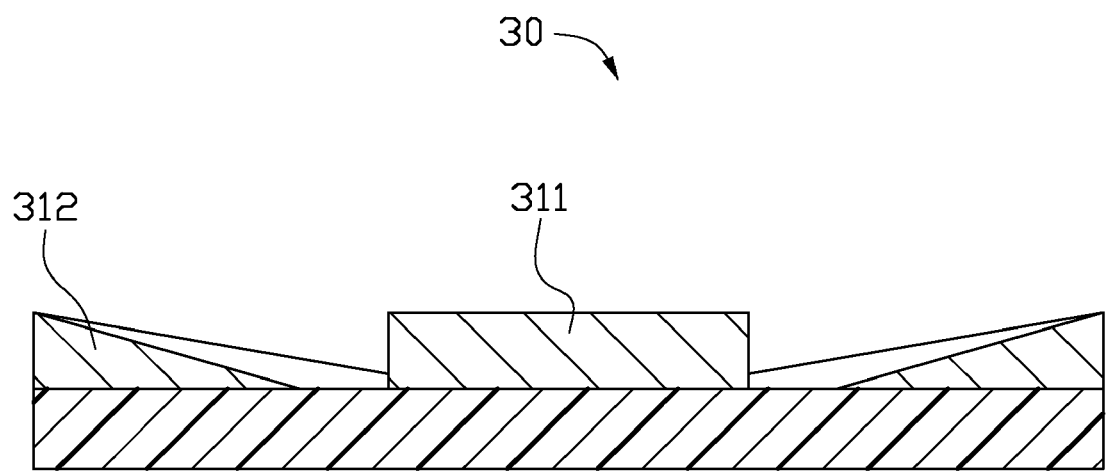
FIG. 11 is an isometric view of a PCB according to a third embodiment.

Referring to FIG. 11, a third PCB 30 is provided in a third embodiment, differing from the PCB 10 in that the thickness of the reinforcing layer 312 linearly increases with increasing distance to the center of the PCB 30. In this embodiment the cross-section of the reinforcing layer 312 is right-triangle shaped. The reinforcing layer 312 is obtained using a method comprising forming a metal layer (not shown) on the peripheral portion using an electro-less plating process or an electro-plating process and a surface grinding process or other method after forming the electrical traces 311. Alternatively, the reinforcing layer 312 can be some other shape in cross-section to increase or decrease the weight thereof as needed.

Furthermore, it is understood that when the PCB 30 is a rectangle shaped, the PCB 30 more easily warps in a direction parallel to a lengthwise direction thereof. Accordingly, a thickness of the reinforcing layer 312 should gradually increase in a direction away from the central portion and the direction should be substantially parallel with the lengthwise direction of the PCB 30.

While certain embodiments have been described and exemplified above, various other embodiments will be apparent to those skilled in the art from the foregoing disclosure. The present disclosure is not limited to the particular embodiments described and exemplified but is capable of considerable variation and modification without departure from the scope of the appended claims.

What is claimed is:

1. A method for manufacturing a printed circuit board, comprising:
    providing a copper clad laminate (CCL), the CCL including an insulating layer and a copper layer formed thereon, the copper layer including a central portion and a peripheral portion surrounding the central portion;
    forming electrical traces in the central portion; and
    forming a reinforcing layer on the peripheral portion at opposite sides of the central portion, a thickness of the reinforcing layer increasing in a direction from the center of the CCL to a periphery thereof.

2. The method as claimed in claim 1, further comprising removing the reinforcing layer, the peripheral portion of the copper layer and a portion of the insulating layer corresponding to the peripheral portion of the copper layer.

3. The method as claimed in claim 1, wherein the reinforcing layer is formed using an electro-less plating process, or an electro-plating process.

4. The method as claimed in claim 1, wherein the reinforcing layer is formed using a method comprising:
    forming a metal layer on the peripheral portion using an electro-less plating process, or an electro-plating process; and
    etching the metal layer to obtain the reinforcing layer.

5. The method as claimed in claim 1, wherein the reinforcing layer is formed using a method comprising:
    forming a metal layer on the peripheral portion using an electro-less plating process, or an electro-plating process; and
    grinding the metal layer to obtain the reinforcing layer.

6. A printed circuit hoard, comprising:
    an insulating layer;
    a copper layer formed on the insulating layer, the copper layer comprising a given portion, a peripheral portion surrounding the given portion, and a plurality of electrical traces at the given portion; and
    a reinforcing layer formed on the peripheral portion of the copper layer at opposite sides of the given portion, a thickness of the reinforcing layer increasing in a direction away from the given portion.

7. The printed circuit board as claimed in claim 6, wherein the thickness of the reinforcing layer linearly increases in the direction away from the given portion.

8. The printed circuit board as claimed in claim 6, wherein the reinforcing layer includes a plurality of stacked layers, the stacked layers comprising an innermost layer directly formed on the copper layer and an outmost layer, a width of the layers decreasing in a direction from the innermost layer to the outmost layer.

9. The printed circuit board as claimed in claim 8, wherein the stacked layers are aligned with each other.

10. The printed circuit board as claimed in claim 6, wherein the reinforcing layer comprises a first portion and a second portion spaced apart from the first portion, the first portion formed on one side of the given portion and the second portion formed on another side of the given portion opposite to the one side.

11. A flexible printed circuit board, comprising:
    an insulating layer;
    an elongated copper layer formed on the insulating layer, the copper layer comprising a central portion, a peripheral portion surrounding the central portion, and a plurality of electrical traces at the central portion; and
    a reinforcing layer formed on the peripheral portion of the copper layer at opposite sides of the central portion, a thickness of the reinforcing layer gradually increasing in a direction away from the central portion, the direction being substantially parallel with a lengthwise direction of the copper layer.

12. The flexible printed circuit board as claimed in claim 11, wherein the reinforcing layer comprises a first portion and a second portion spaced apart from the first portion, the first portion formed on one side of the central portion and the second portion formed on another side of the central portion opposite to the one side.

* * * * *